(12) United States Patent
Mo et al.

(10) Patent No.: US 11,362,632 B2
(45) Date of Patent: Jun. 14, 2022

(54) HIGH-CAPACITY COMMON-MODE INDUCTOR PROCESSING CIRCUIT FOR NETWORK SIGNAL

(71) Applicant: AJOHO ENTERPRISE CO., LTD., Taipei (TW)

(72) Inventors: Chia-Ping Mo, Taipei (TW); Chun-Yen Yeh, Taipei (TW)

(73) Assignee: AJOHO ENTERPRISE CO., LTD, Taipei (TW)

( * ) Notice: Subject to any disclaimer, the term of this patent is extended or adjusted under 35 U.S.C. 154(b) by 166 days.

(21) Appl. No.: 16/845,688

(22) Filed: Apr. 10, 2020

(65) Prior Publication Data

US 2021/0320637 A1 Oct. 14, 2021

(51) Int. Cl.
*H03H 1/00* (2006.01)
*H03H 7/42* (2006.01)
*H01R 13/719* (2011.01)
*H03H 7/01* (2006.01)

(52) U.S. Cl.
CPC ......... *H03H 1/0007* (2013.01); *H01R 13/719* (2013.01); *H03H 7/0115* (2013.01); *H03H 7/427* (2013.01)

(58) Field of Classification Search
CPC ..... H03H 7/0115; H03H 1/0007; H03H 7/427
USPC ................................ 333/175, 177, 181, 185
See application file for complete search history.

(56) References Cited

U.S. PATENT DOCUMENTS

| | | | |
|---|---|---|---|
| 3,657,724 A * | 4/1972 | Feeley ................... | B23K 9/091 |
| | | | 219/130.51 |
| 6,396,362 B1 * | 5/2002 | Mourant ................. | H03H 7/42 |
| | | | 333/25 |
| 9,979,370 B2 * | 5/2018 | Xu ........................ | H03H 7/0115 |
| 10,645,811 B2 * | 5/2020 | Dinh .................... | H01F 27/2828 |
| 2018/0270924 A1 * | 9/2018 | De Anna ............... | H05B 45/50 |

* cited by examiner

*Primary Examiner* — Rakesh B Patel

(74) *Attorney, Agent, or Firm* — Muncy, Geissler, Olds & Lowe, P.C.

(57) ABSTRACT

A high-capacity common-mode inductor processing circuit for network signal is disclosed. Each of high-capacity common-mode inductors is disposed between two adjacent circuit channels to perform signal coupling, and each high-capacity common-mode inductor has parasitic capacitance between primary and secondary sides thereof, each of autotransformers is disposed on a side of corresponding one of the high-capacity common-mode inductors, and center tap lines of the autotransformers are grounded. The high-capacity common-mode inductor includes an iron core post and an iron core cover, the iron core post includes a winding part to be wound by conductive wires, and the conductive wires are wound on the winding part by a preset number of turns, and upwardly stacked and wound on the winding part by a preset layer number. The high-capacity common-mode inductors and the parasitic capacitances can eliminate noise on the circuit channels and perform signal coupling.

5 Claims, 5 Drawing Sheets

HIGH-CAPACITY COMMON-MODE INDUCTOR PROCESSING CIRCUIT FOR NETWORK SIGNAL

BACKGROUND OF THE INVENTION

1. Field of the Invention

The present invention provides a high-capacity common-mode inductor processing circuit for network signal, and more particularly to a processing circuit using high-capacity common-mode inductors and parasitic capacitances applied to a network device to eliminate noise on circuit channels and perform signal coupling.

2. Description of the Related Art

In recent years, with rapid development of computer technology, the computer development trend is towards higher computing power, fast speed and small size, and network communication technology is also rapidly developing, so people's lives, studies, works and leisure enter another brand-new field different from the past, and people can transmit real-time information, advertisements or emails to and from each other through network communication, and can also search various information, perform instant communication or online game through network. As a result, the relationship between people and network becomes more fervent and indispensable.

Furthermore, cable connection and wireless transmission are used in network to transmit data, and the cable connection technology requires installation of a network connector. With usage of network becoming more and more widespread, the amount of data transmitted through network is becoming larger and larger, for example, the transmission speed of network is increased from the early 10 Mbps to 100 Mbps and 1 Gbps, and even the fiber-optic network transmission speed now introduced can reach more than 10 Gbps. During the process of network signal transmission, the transmitted signals are easily affected and interfered by electromagnetic wave or noise (for example, the noise includes differential-mode noise formed between electronic circuits and common-mode noise formed between the conductive wires and a ground side) of surrounding electronic components, and it causes instability of network signal transmission. The general solution is to set filter components inside the network connector to filter the network signals, so as to reduce the interference of electromagnetic waves and noise.

In the conventional network connector, multiple circuits are often connected in series to coupling capacitors serving as filter components, and further connected to a plurality of autotransformers or common-mode inductors that can perform noise filtering or lightning protection, so that the coupling capacitors, and the autotransformers or the common-mode inductors can enable the conventional network connector to have the functions of filtering specific noise and performing lighting protection; however, the conventional circuit is still not simple enough and has poor performance in application of high-frequency transmission network and elimination of low-frequency noise. On the other hand, the rise of the e-sports industry also leads development of computer hosts towards high performance, but the side effect of the high-performance computer is significant increase of power consumption of motherboard, and serious electromagnetic interference (EMI) caused by high current transmission in the motherboard. Therefore, the solution for the aforementioned problems becomes a key issue in this industry.

SUMMARY OF THE INVENTION

In order to solve the conventional problem, the inventors develop a high-capacity common-mode inductor processing circuit for network signal according to collected data, multiple evaluations, tests and modifications, and years of research experience.

An objective of the present invention is to provide a high-capacity common-mode inductor processing circuit for network signal, and the high-capacity common-mode inductor processing circuit comprises a plurality of high-capacity common-mode inductors, and each high-capacity common-mode inductor is disposed between each two adjacent circuit channels for signal coupling, and has at least one parasitic capacitance existing between a primary side and a secondary side thereof, each of a plurality of autotransformers is disposed on a side of corresponding one of the plurality of high-capacity common-mode inductors, and center tap lines of the plurality of autotransformers are electrically connected to each other and to a ground side; each high-capacity common-mode inductor includes an iron core post and an iron core cover, the iron core post comprises a winding part configured to be wound by conductive wires, and the conductive wires are wound on the winding part of the iron core post by a preset number of turns, and upwardly stacked and wound on the winding part of the iron core post by a preset layer number; as a result, the plurality of high-capacity common-mode inductors and the plurality of parasitic capacitances can be used to eliminate noise on the circuit channels, so as to achieve the purpose of replacing the coupling capacitors disposed in the circuits inside the conventional network connector by the parasitic capacitances serving as signal coupling devices, thereby further simplifying the high-capacity common-mode inductor processing circuit for network signal and reducing manufacturing cost.

Another objective of the present invention is that each of a length, a height and a width of the high-capacity common-mode inductor is lower than or equal to 10 mm, and a length of the winding part of the iron core post is in a range of 0.6 mm to 9 mm.

Another objective of the present invention is that the conductive wires are wound on the winding part by the preset number of turns in a range of 10 to 90, and the preset layer number is in a range of 1 to 9, so as to form the total number of turns of the wound conductive wires in a range of 10 to 810.

Another objective of the present invention is that each of the conductive wires is an enamelled wire, and the enamelled wire includes at least one of a polyurethane enamelled wire, a polyurethane overcoat polyamide enamelled wire or a modified polyester overcoat polyamide-imide enamelled wire.

Another objective of the present invention is that the bonding parts of the iron core post are connected to the iron core cover by using magnetic or non-magnetic glue to bond.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
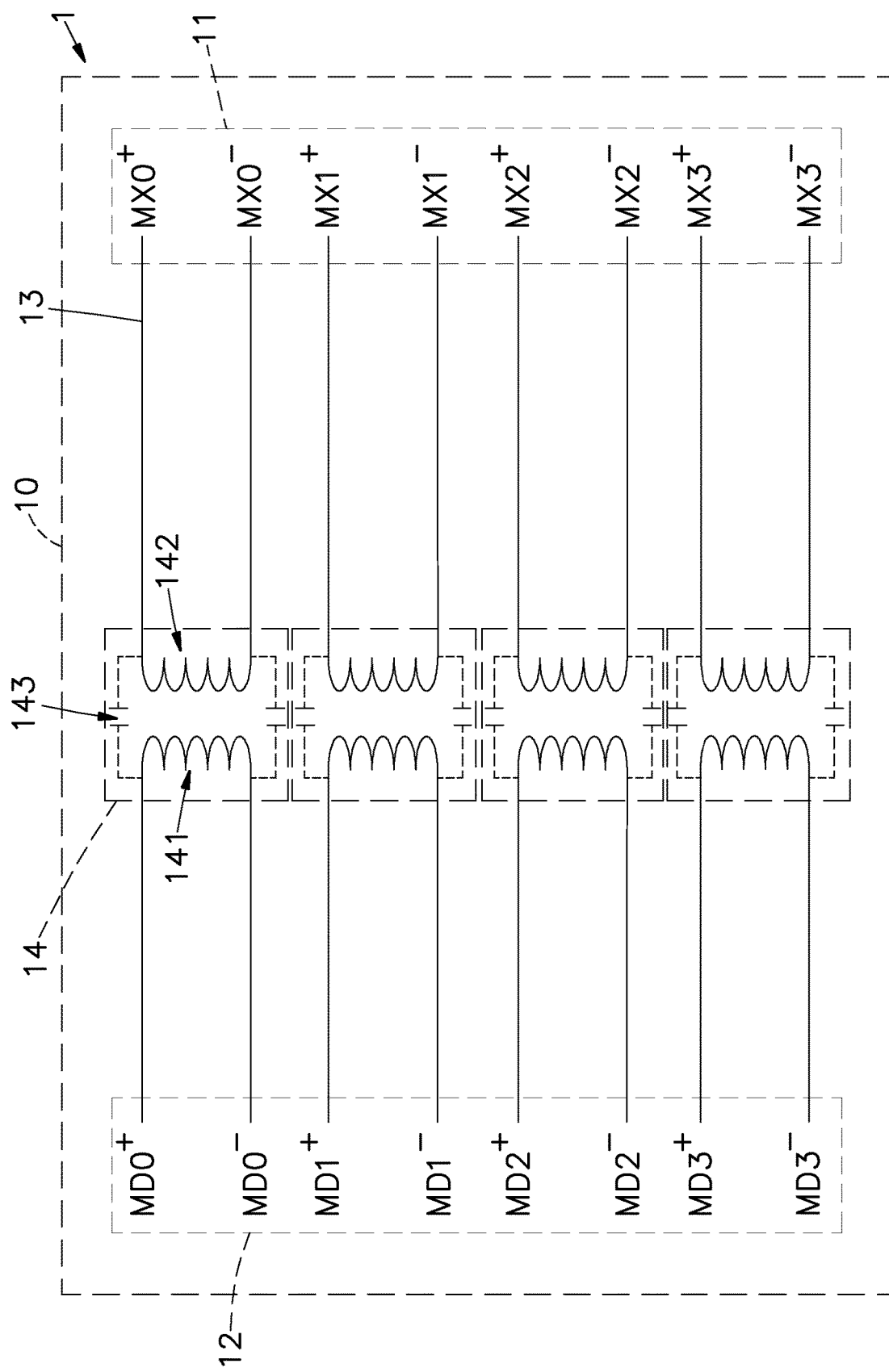
FIG. 1 is a first circuit diagram of a high-capacity common-mode inductor processing circuit for network signal, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

Figure 2:
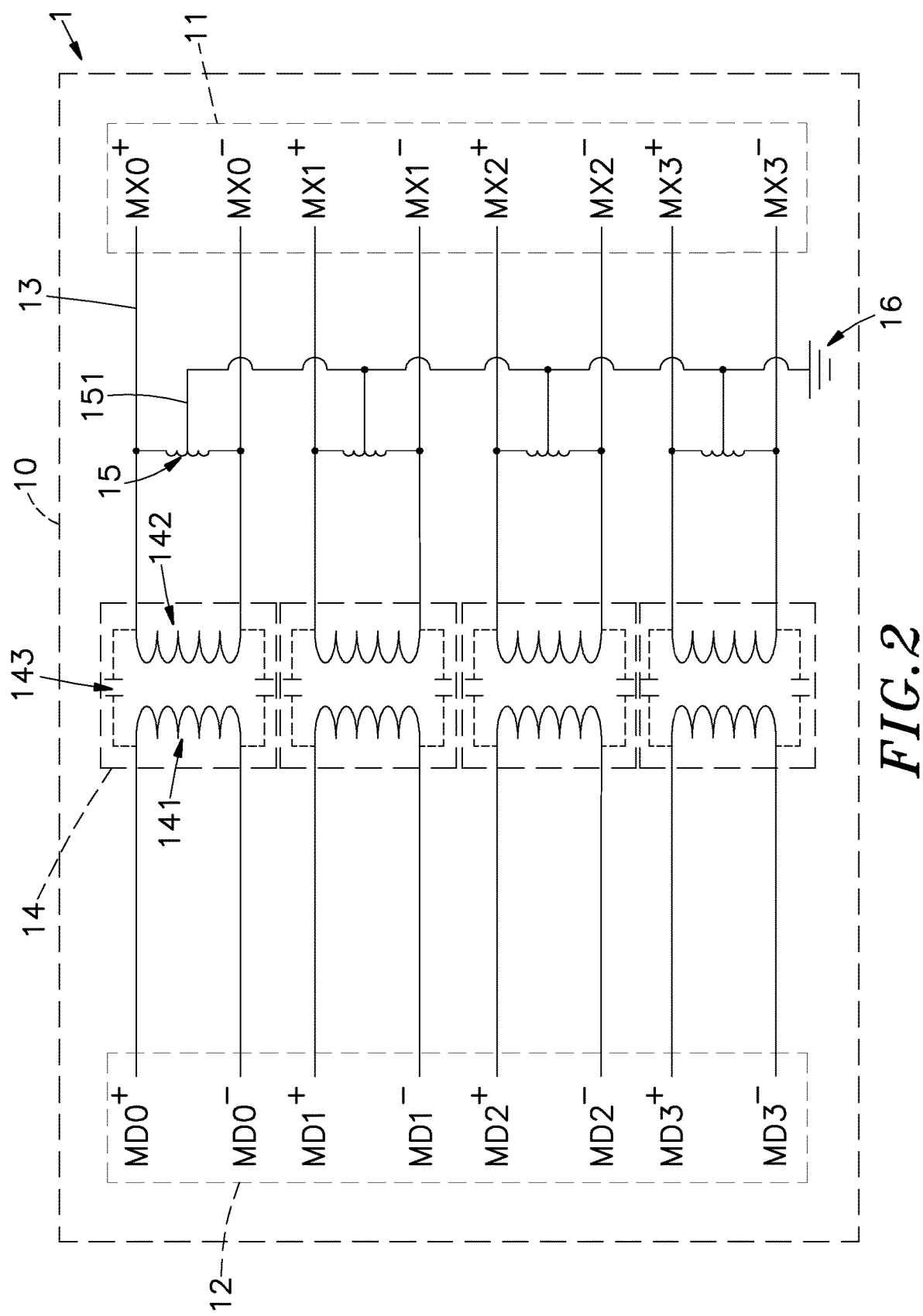
FIG. 2 is a second circuit diagram of the high-capacity common-mode inductor processing circuit for network signal, according to the present invention.

Please refer to FIGS. 1 and 2, which are first and second circuit diagrams of a high-capacity common-mode inductor processing circuit for network signal, according to the present invention. As shown in FIGS. 1 and 2, the high-capacity common-mode inductor processing circuit includes a processing circuit 1 disposed on a circuit board 10. The processing circuit 1 has a first connection end 11 electrically connected to a preset network connector (not shown in FIGS. 1 and 2), and a second connection end 12 electrically connected to a preset network chip (not shown in FIGS. 1 and 2), and a plurality of circuit channels 13 disposed between the first connection end 11 and the second connection end 12.

Please refer to FIG. 1 first. Each high-capacity common-mode inductor 14 is disposed between two adjacent circuit channels 13 to perform signal coupling, and in this embodiment, four high-capacity common-mode inductors 14 are disposed in 8 circuit channels 13, but the present invention is not limited to this example. Each high-capacity common-mode inductor 14 has at least one parasitic capacitance 143 existing between a primary side 141 and a secondary side 142 thereof. The above-mentioned components form the processing circuit of FIG. 1. Besides the components shown in FIG. 1, the processing circuit of FIG. 2 further includes a plurality of autotransformers 15 which each is disposed on a side of corresponding one of the high-capacity common-mode inductors 14, and center tap lines 151 of the plurality of autotransformers 15 are electrically connected to each other and to a ground side 16, so as to form the processing circuit of FIG. 2.

Figure 3:
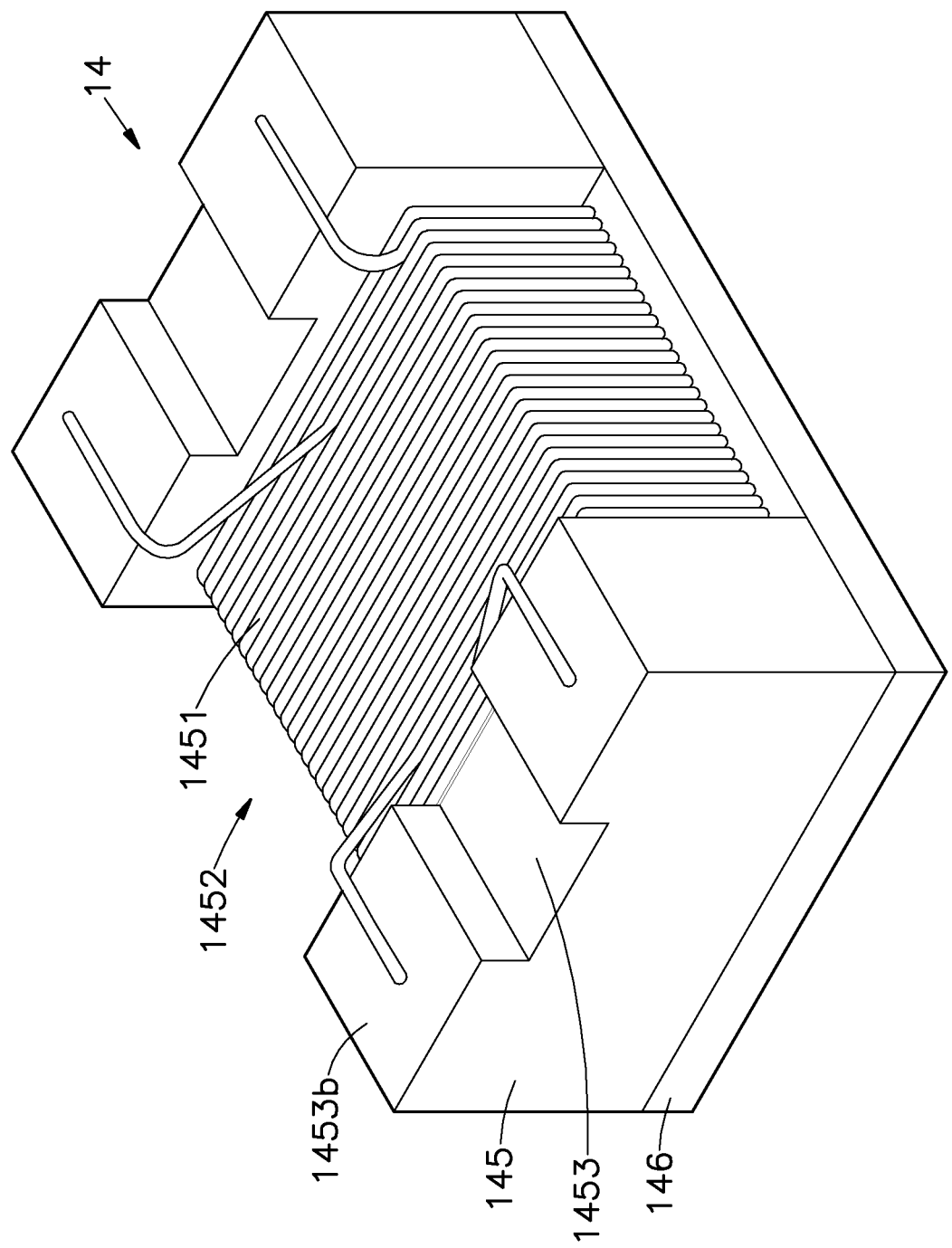
FIG. 3 is a perspective diagram of a high-capacity common-mode inductor of the present invention.
Figure 4:
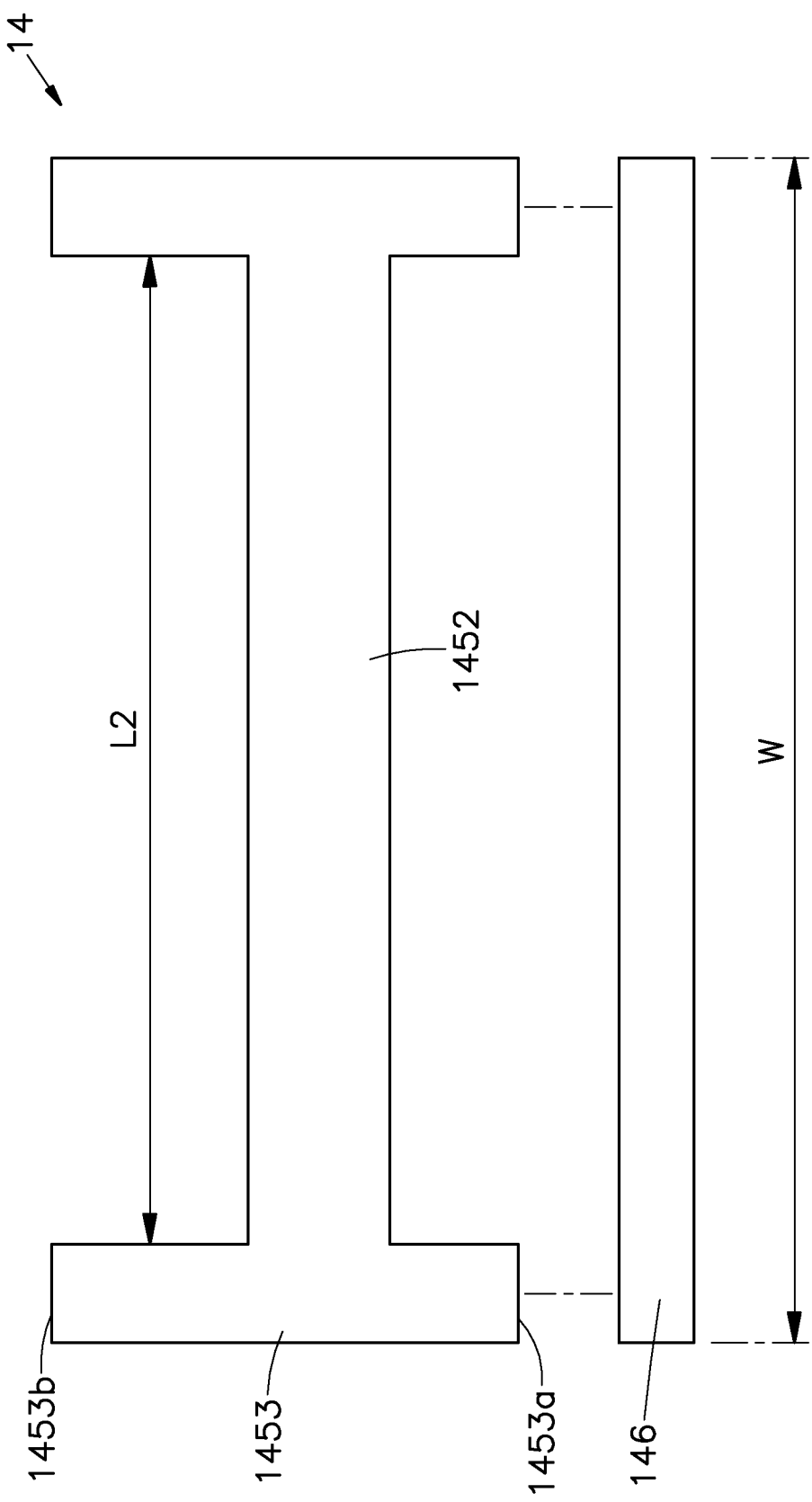
FIG. 4 is an exploded structural diagram of the high-capacity common-mode inductor of the present invention.
Figure 5:
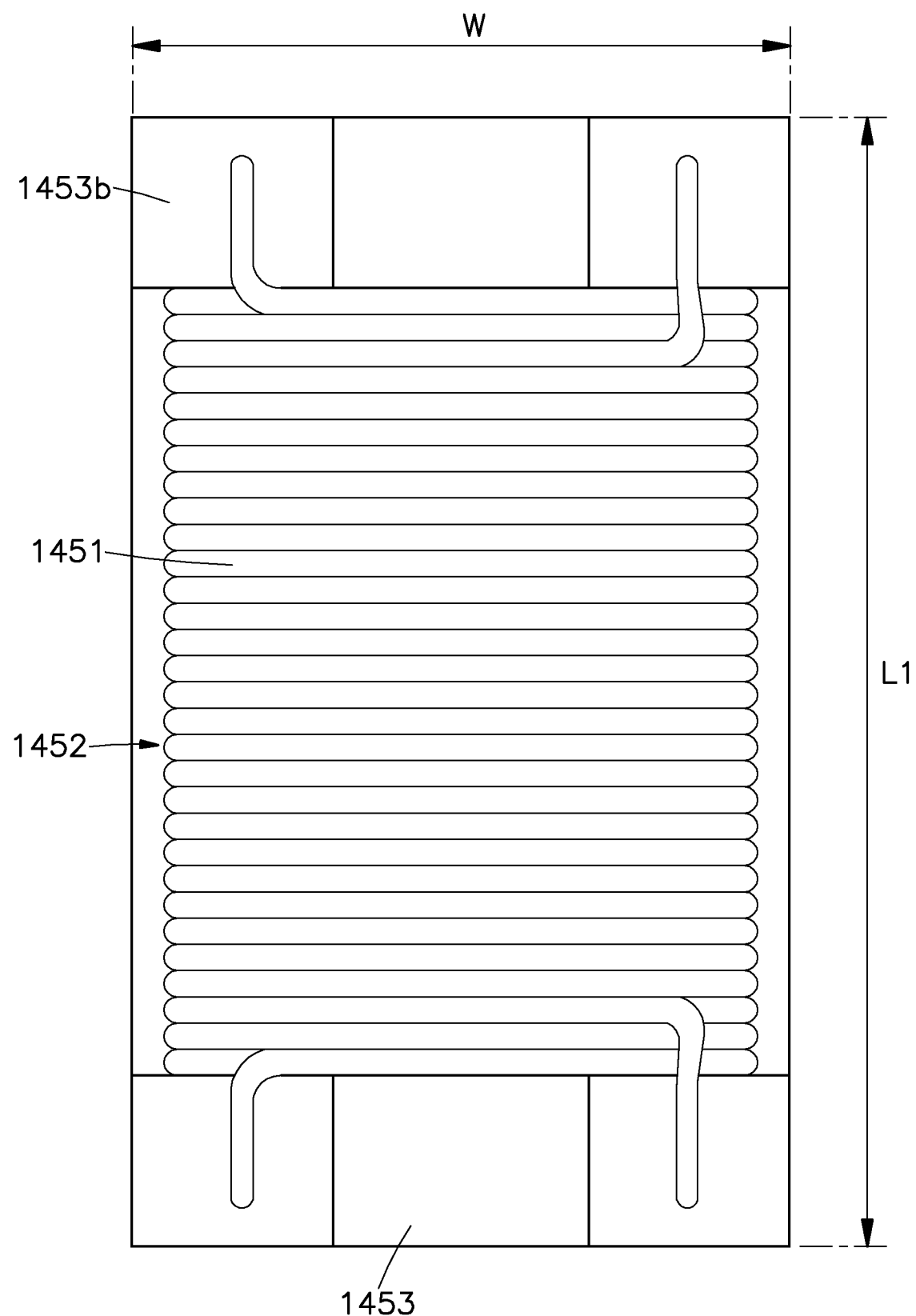
FIG. 5 is a front diagram of the high-capacity common-mode inductor of the present invention.

Please refer to FIGS. 3 to 5, which show a perspective diagram, an exploded structural diagram and a front diagram of the high-capacity common-mode inductor of the present invention. As shown in FIGS. 3 to 5, the high-capacity common-mode inductor 14 includes an I-shaped iron core post 145 and a plate-shaped iron core cover 146, the iron core post 145 includes a winding part 1452 to be wound by a plurality of conductive wires 1451, and two support plates 1453 connected to two ends of the winding part 1452; each support plate 1453 comprises a bonding part 1453a disposed on a side thereof and connected to the iron core cover 146, and two solder parts 1453b of the primary side 141 and two solder parts 1453b of the secondary side 142 disposed on other side thereof and connected to two ends of the plurality of conductive wires 1451; the solder parts 1453b are soldered on the plurality of circuit channels 13 of the circuit board 10. The conductive wires 1451 are wound on the winding part 1452 of the iron core post 145 by a preset number of turns, and upwardly stacked and wound on the winding part 1452 by a preset layer number, so as to form an inductance value of the high-capacity common-mode inductor 14 in a range of 100 μH to 250 μH, and form the parasitic capacitance 143 in a range of 10 pF to 200 pF, and the plurality of high-capacity common-mode inductors 14 and the plurality of parasitic capacitances 143 can be used to eliminate noise on the circuit channels 13 and perform signal coupling. The noise is caused by electromagnetic interference due to high current transmission on the motherboard of the high-performance computer, and a large portion of the noise is common-mode noise and a small portion of the noise is differential-mode noise. As a result, the effect of replacing the coupling capacitors disposed in the circuits inside the conventional network connector by the parasitic capacitances 143 serving as the signal coupling components can be achieved, and the high-capacity common-mode inductor processing circuit for network signal can be further simplified and the manufacturing cost thereof can be reduced.

Preferably, each of a length L1, a width W and a height H of the high-capacity common-mode inductor 14 is lower than or equal to 10 mm, and a length L2 of the winding part 1452 of the iron core post 145 is in a range of 0.6 mm to 9 mm. When the length L1 of the high-capacity common-mode inductor 14 is equal to 10 mm, the total length of the two support plates 1453 of the high-capacity common-mode inductor 14 can be in a range of 0.1 mm to 0.3 mm.

The conductive wires 1451 are wound on the winding part 1452 by the preset number of turns in a range of 10 to 90, and the preset layer number is in a range of 1 to 9, so as to form the total number of turns of the wound conductive wires 1451 in a range of 10 to 810. When the numbers of the turns and layers of the wound conductive wires 1451 do not reach the above-mentioned defined ranges, it causes that the high-capacity common-mode inductor 14 fails to have the high preset inductance value, and the parasitic capacitance 143 fails to reach the preset capacitance value, and the processing circuit of the present invention fails to achieve the predetermined signal coupling effect; for this reason, the ranges of the numbers of the preset turns and layers of the conductive wires 1451 are very important.

The relationship between the high-capacity common-mode inductor 14, the total number of turns of the wound conductive wires 1451, and the parasitic capacitance 143 will be described in following paragraph. For example, in manufacturing process of the high-capacity common-mode inductor 14, an initial inductance value (AL) is 4.4 μH, and after the conductive wires are wound on the winding part 1452 of the iron core post 145 by 38 turns, the theoretical inductance value can be 4.4 μH×38 (turns)=167.2 μH; however, the actually measured inductance value is about 150 μH, and the parasitic capacitance 143 generated between the primary side and the secondary side of the high-capacity common-mode inductor 14 is 10 pF.

In another example, the initial inductance value (AL) of the high-capacity common-mode inductor 14 is 4.4 μH, and after the conductive wires are wound on the winding part 1452 of the iron core post 145 by 42 turns, the theoretical inductance value can be 4.4 μH×42 (turns)=184.8 μH; however, the actually measured inductance value is about 170 μH, and the parasitic capacitance 143 formed between the primary side and the secondary side of the high-capacity common-mode inductor 14 is 12 pF.

According to the two aforementioned examples, it is clear that the amount of the conductive wires 1451 wound on the winding part 1452 of the iron core post 145 of the high-capacity common-mode inductor 14 is more, the values of the inductance value and the parasitic capacitance 143 of the high-capacity common-mode inductor 14 are higher; therefore, the number of the turns of the conductive wires 1451, wound on the winding part 1452 of the iron core post 145, required to make the inductance value of the high-capacity common-mode inductor 14 reach the preset desired range of 100 μH to 250 μH and make the generated parasitic capacitance 143 reach the range of 10 pF to 200 pF can be obtained by calculation, and after the conductive wires 1451 are wound by the calculated number of turns, the values of the inductance and the parasitic capacitance 143 can be measured and verified whether to reach the preset result, and the above-mentioned process can make the high-capacity common-mode inductor 14 meet the requirement in network signal transmission.

In an embodiment, the conductive wire 1451 can be an enamelled wire, and the enamelled wire can include at least one of a polyurethane enamelled wire, a polyurethane overcoat polyamide enamelled wire, and a modified polyester overcoat polyamide-imide enamelled wire.

The bonding parts 1453a of the iron core post 145 are connected to the iron core cover 146 by using magnetic or non-magnetic glue to bond.

The plurality of high-capacity common-mode inductors 14 and the plurality of parasitic capacitances 143 can be used to eliminate differential-mode noise and common-mode noise existing on the circuit channels 13. The function of filtering out noise can be performed by the inductive components formed by the plurality of high-capacity common-mode inductors 14, to filter out the preset AC and high-frequency noise and further perform signal coupling; furthermore, the capacitive components formed by the parasitic capacitances 143 connected between the primary sides 141 and the secondary sides 142 of the high-capacity common-mode inductors 14 can be used to filter out preset DC and low-frequency noise and perform signal coupling, and in a condition that the above-mentioned noise is filtered out, the network connector can reach a high and stable transmission speed in high frequency signal transmission. During network transmission, the middle-frequency transmission signal and low-frequency (such as 10 Mbps/100 Mbps) transmission signals can be coupled through the inductors (such as the high-capacity common-mode inductors), the high-frequency (such as 1 Gbps) transmission signals transmitted in network can be coupled through the parasitic capacitances, thereby improving stability of the network connector in high frequency signal transmission.

According to FIGS. 1 to 5, the present invention provides a high-capacity common-mode inductor processing circuit for network signal, and in the processing circuit, each high-capacity common-mode inductor is disposed between two adjacent circuit channels to perform signal coupling, and has at least one parasitic capacitance existing between a primary side and a secondary side thereof, each of autotransformers is disposed on a side of corresponding one of the high-capacity common-mode inductors, and center tap lines of the autotransformers are electrically connected to each other and to a ground side; the high-capacity common-mode inductor includes an iron core post and an iron core cover, the iron core post includes a winding part to be wound by conductive wires, and the conductive wires are wound on the winding part of the iron core post by a preset number of turns, and upwardly stacked and wound on the winding part by a preset layer number, so that the high-capacity common-mode inductors and the parasitic capacitances can be used to eliminate noise on the circuit channels and perform signal coupling, thereby achieving the effect of replacing the coupling capacitors disposed in the circuits inside the conventional network connector by the parasitic capacitances serving as the signal coupling components, and further simplifying the high-capacity common-mode inductor processing circuit for network signal and reducing manufacturing cost. As a result, the high-capacity common-mode inductor processing circuit of the present invention is very practical in the field of high-capacity common-mode inductor processing circuit for network signal and is competitive in market.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A high-capacity common-mode inductor processing circuit unit for a network signal, comprising:

a processing circuit disposed on a circuit board, and having a first connection end electrically connected to a preset network connector, and a second connection end electrically connected to a preset network chip, and a plurality of circuit channels disposed between the first connection end and the second connection end, wherein the processing circuit comprises a plurality of high-capacity common-mode inductors, and each of the plurality of high-capacity common-mode inductors is disposed between each two adjacent circuit channels for signal coupling, has at least one parasitic capacitance existing between a primary side and a secondary side thereof, and comprises an I-shaped iron core post and a plate-shaped iron core cover, the iron core post comprises a winding part configured to be wound by a plurality of conductive wires, and two support plates connected to two ends of the winding part, respectively, and the two support plates comprises bonding parts formed on sides thereof and connected to the iron core cover, and two solder parts of the primary side and two solder parts of the secondary side disposed on other sides thereof and configured to be soldered with two ends of the plurality of conductive wires, respectively, and the plurality of solder parts are soldered on the plurality of circuit channels of the circuit board, respectively, and the plurality of conductive wires are wound on the winding part of the iron core post by a preset number of turns, and upwardly stacked and wound on the winding part of the iron core post by a preset layer number, so as to form an inductance value of each of the plurality of high-capacity common-mode inductors in a range of 100 μH to 250 μH, and the at least one parasitic capacitance of each of the plurality of high-capacity common-mode inductors in a range of 10 pF to 200 pF, wherein the plurality of high-capacity common-mode inductors and the plurality of parasitic capacitances are configured to eliminate noise on the plurality of circuit channels and perform signal coupling, each of a length, a height and a width of each of the plurality of high-capacity common-mode inductors is lower than or equal to 10 mm, and a length of the winding part of the iron core post of each of the plurality of the high-capacity common-mode inductors is in a range of 0.6 mm to 9 mm.

2. The high-capacity common-mode inductor processing circuit unit according to claim 1, further comprising a plurality of autotransformers, wherein each of the plurality of autotransformers is disposed on a side of corresponding one of the plurality of high-capacity common-mode inductors, and center tap lines of the plurality of the autotransformers are electrically connected to each other and to a ground side.

3. The high-capacity common-mode inductor processing circuit unit according to claim 1, wherein the bonding parts of the iron core post are connected to the iron core cover by using magnetic or non-magnetic glue to bond.

4. The high-capacity common-mode inductor processing circuit unit according to claim 1, wherein the plurality of conductive wires are wound on the winding part by the preset number of turns in a range of 10 to 90, and the preset layer number is in a range of 1 to 9, so as to form a total number of turns of the plurality of wound conductive wires in a range of 10 to 810.

5. The high-capacity common-mode inductor processing circuit unit according to claim 1, wherein each of the plurality of conductive wires is an enameled wire, and the enameled wire includes at least one of a polyurethane enameled wire, a polyurethane overcoat polyamide enameled wire and a modified polyester overcoat polyamide-imide enameled wire.

* * * * *